United States Patent [19]
Farassat

[11] Patent Number: 5,979,737
[45] Date of Patent: Nov. 9, 1999

[54] ULTRASONIC BONDING HEAD COMPRISING A LINEAR MOTOR FOR ADJUSTING THE PRESSURE ACCORDING TO A PIEZO DETECTOR

[75] Inventor: Farhad Farassat, Taufkirchen, Germany

[73] Assignee: F & K Delvotec Bondtechnik GmbH, Ottobrunn, Germany

[21] Appl. No.: 08/877,396

[22] Filed: Jun. 17, 1997

[51] Int. Cl.[6] .............................. B23K 1/06; B23K 37/00
[52] U.S. Cl. ............................................. 228/1.1; 228/4.5
[58] Field of Search .................................. 228/110.1, 1.1, 228/102, 180.5

[56] References Cited

U.S. PATENT DOCUMENTS

| | | | |
|---|---|---|---|
| 4,603,802 | 8/1986 | Kurtz et al. ............................. | 228/1.1 |
| 4,610,387 | 9/1986 | Scavino ................................. | 228/1.1 |
| 4,806,193 | 2/1989 | Von Raben et al. ................... | 156/378 |
| 4,854,494 | 8/1989 | Von Raben ........................... | 228/102 |
| 5,158,223 | 10/1992 | Shimizu ................................ | 228/1.1 |
| 5,219,112 | 6/1993 | Mochida et al. ...................... | 228/4.5 |
| 5,230,458 | 7/1993 | Asanasavest ......................... | 228/102 |
| 5,314,105 | 5/1994 | Farassat ............................... | 228/102 |
| 5,323,948 | 6/1994 | Yamazaki et al. .................... | 228/4.5 |
| 5,868,300 | 2/1999 | Babayan .............................. | 228/180.5 |

Primary Examiner—Patrick Ryan
Assistant Examiner—Carlos J. Gamino
Attorney, Agent, or Firm—Westman, Champlin & Kelly, P.A.

[57] ABSTRACT

A bonding head is provided for a wire bonding machine which comprises a capillary connected to a transducer for applying pressure and ultrasonic energy to a wire guided into contact with a surface to which a wire bond is to be formed. The transducer is biased by a spring mounted at one end to a linear motor for adjustment of the urging force of the spring. The actual force applied to the wire is measured by detecting means. Control means are provided which are connected to the linear motor for adjusting the urging force of the spring, to thereby obtain a desired pressure to be applied to the wire.

10 Claims, 2 Drawing Sheets

ULTRASONIC BONDING HEAD COMPRISING A LINEAR MOTOR FOR ADJUSTING THE PRESSURE ACCORDING TO A PIEZO DETECTOR

The present invention relates to a bonding head for a wire bonding machine used in the electronic industry in the preparation of a wide variety of electronic devices.

Such wire bonding machines generally comprise means for supplying an aluminum or gold wire to a wedge. Commonly a capillary holds and guides the wire to a point on the substrate of the electronic component where a bond is required. The capillary is also connected to a transducer for supplying ultrasonic energy through the capillary to the wire to cause bonding. Conventionally, the transducer is pivotally mounted and biased toward the substrate, producing a preprogrammed force applied to the wire by the capillary when in contact with the substrate.

In such conventional devices, the preprogrammed bonding force may go out of calibration after a given time of operation of the bonding machine. The bonding operation must be interrupted and the desired bonding force readjusted.

An object of the present invention is to provide a bonding head in which the above problems of pressure adjustment are avoided. In addition, it would be desirable to provide a bonding head which can be moved from point to point on the substrate for bonding with greater speed.

According to the present invention, a bonding head for a wire bonding machine is provided as defined in claim 1. Means are provided for adjusting the pressure applied to the wire (bonding force) in a self-adjusting manner. Preferably, the transducer means are spring biased by means of a linearly displaceable element connected to a linear motor. By adjusting the urging force of the spring applied to the transducer, the bonding force applied to the wire can be set to a predetermined value. The adjustment means further comprise control means including an electric loop connected to drive the linear motor. When it is determined that the actual bonding force deviates from the desired bonding force, the linear motor is driven to expand or contract the spring, thereby re-establishing the proper biasing force on the transducer.

Further objects and advantages of the invention will become apparent in the following description of embodiments in conjunction with the drawings, in which.

As is well known in the present art, a wide variety of bonding machines exists. The components of the machine may vary depending on the type of wire being bonded, for example gold or aluminum, and depending on the thickness of the wire. In addition, various types of arrangements are provided depending on the bonding procedure, i.e. ball bonding, wedge bonding, etc. The embodiment shown here relates to wedge bonding with a capillary, while the invention is not limited to this arrangement.

Figure 1:
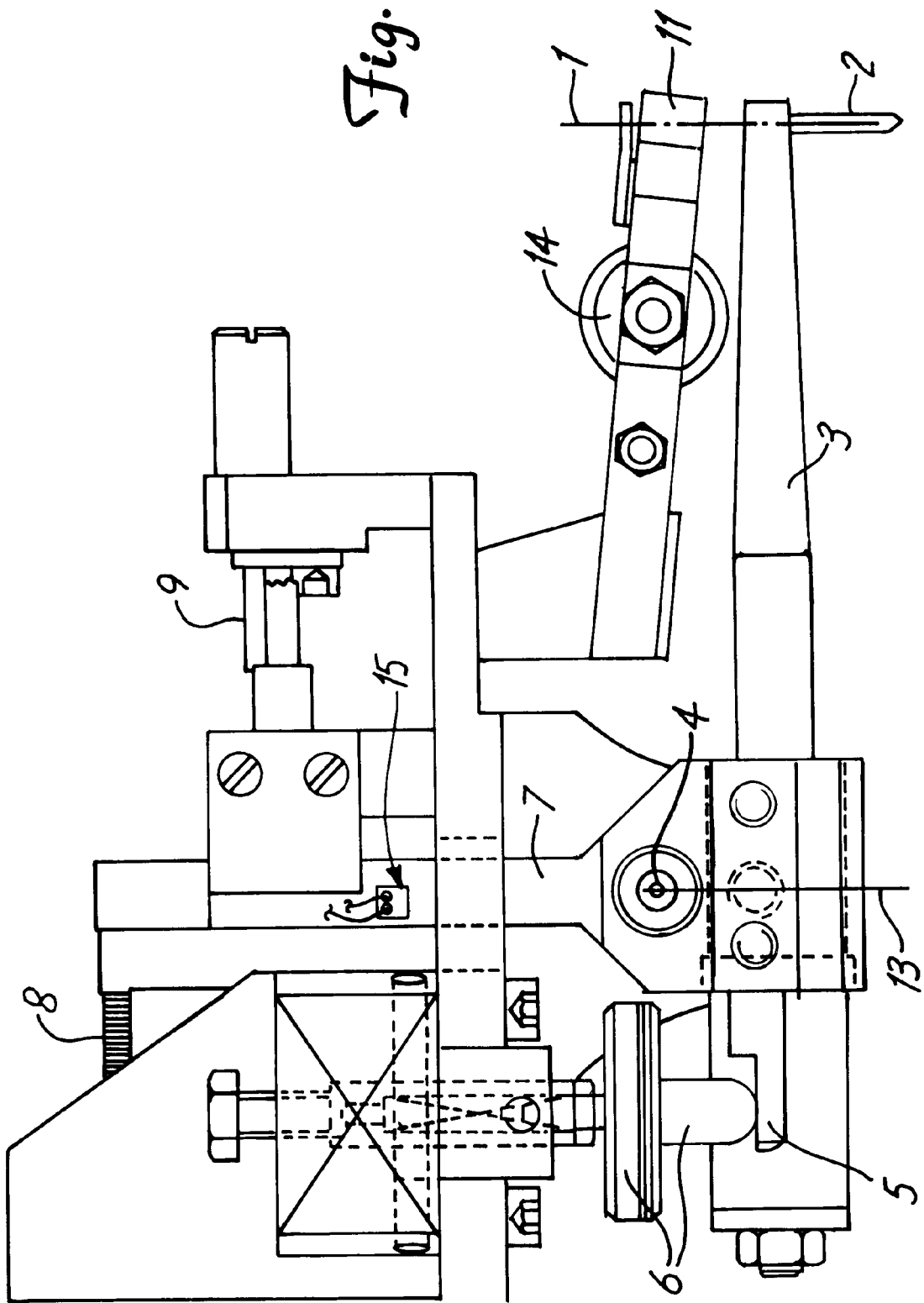
FIG. 1 shows an elevation view of a bonding head according to an embodiment of the present invention.

FIG. 1 shows a bonding head comprising a capillary (wedge or guide) 2 for guiding a wire 1 to a point on a substrate to be bonded. The wire 1 is supplied by supply means (not shown) to a wire clamp 11. The capillary 2 guides the wire to a substrate and is connected to a transducer 3 for providing ultrasonic energy.

Figure 2:
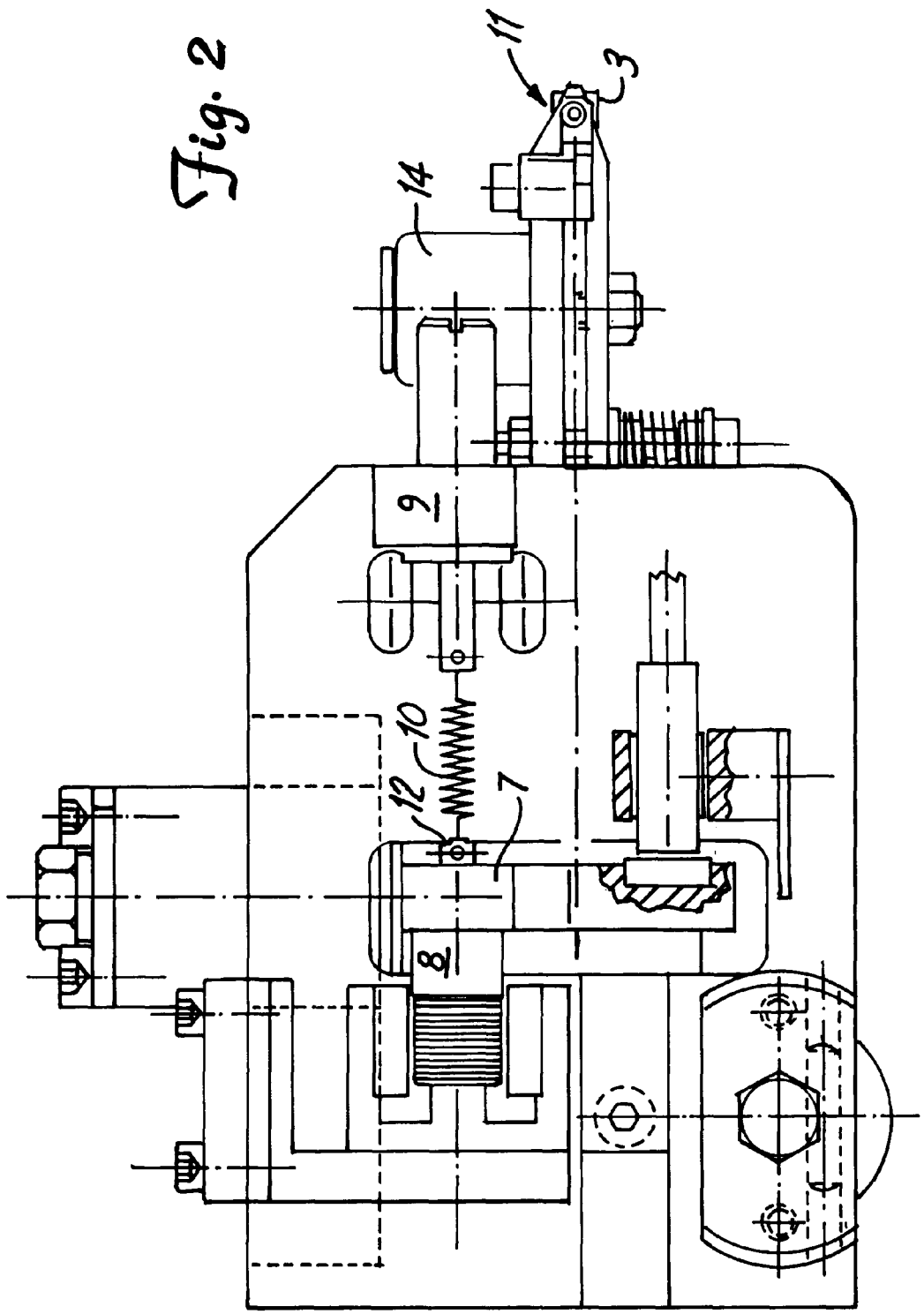
FIG. 2 shows a plan view of the bonding head of FIG. 1.

The transducer 3 is pivotally mounted at the pivot 4 and is fixed to a transducer holder 7, which rotates with the transducer 3. The transducer holder 7 is attached at its upper end to a spring 10 by element 12. The spring 10 is fixed at one end to a mounting 9 fixed to the bonding head body. The other end of the spring 10 is fixed to a substantially linear displaceable element 12 as seen in FIG. 2. The element 12 is substantially linear displaceable by a linear motor 8. The biasing force of the spring 10 urging the transducer holder 7 to the right as shown in FIG. 2 is therefore adjustable in its urging force.

Returning to FIG. 1, the end 5 of the transducer 3 opposing the capillary end abuts against a detecting means 6, which also acts as a stop. In the non-bonding position as shown in FIG. 1, the spring 10 biases the end 5 against the detecting means 6. The detecting means 6 (or detector) preferably comprise a piezo element, which generates an electric signal depending on the magnitude of the force exerted by the end 5 of the transducer 3. A corresponding signal from the detecting means 6 is supplied to control means (not shown) in which the present force is determined. This force in turn corresponds to the bonding force or the bonding pressure applied by the capillary 2 to the wire 1 at the time of touch-down, i.e. when the bonding head is lowered and the wire is brought into contact with the substrate.

The control means comprise an electric circuit adapted to determine the actual force detected by the piezo element. Moreover, the circuit is provided with comparison means for comparing the actual force with a desired force to be applied during bonding. If the actual force deviates from the desired force by more than a predetermined value, the control means are further adapted to drive the linear motor 8 and appropriately expand or contract the spring 10 to adjust its biasing force. For this purpose, the control circuit comprises a loop connected to the electrical drive of the linear motor.

The ability to adjust the bonding force by means of the control loop and the linear adjustment of the biasing spring provides several advantages in the bonding process. Over a period of time, the predetermined or desired bonding or pressure can deteriorate, due for example to temperature changes, development of friction in various components of the bonding head, or even variations in the spring constant due to aging or fatigue of the biasing spring. According to the invention, such deviations from the desired bonding pressure can be automatically detected. When the deviation is too large, the control means automatically readjust the bonding pressure by the appropriate control adjustment of the linear motor B. An interruption of the bonding process to recalibrate the bonding force is no longer required.

Another advantage of the automatic adjustment means is that the amount of tension in the biasing spring can be adjusted at different time intervals within the bonding operation. For example, during the slow downward movement of the bonding head close to touch down, the precise bond pressure can be adjusted as described above. During the transfer interval after touch down and for the next touch down, the bonding head is normally moved much faster. In this transfer period, the tension of the spring can be increased, whereby undesired vibration of the transducer and capillary is avoided.

In another embodiment of the present invention, the detecting means 6, preferably a piezo element, is mounted to be vertically displaceable on the bonding head. In this embodiment, the control means further comprise a control loop for vertical drive means of the piezo element. As the bonding head approaches the touch down region as shown in FIG. 1, the transducer is substantially horizontal with respect to the substrate. When reaching the touch down region, the piezo element 6 is driven downwardly, rotating the capillary end of the transducer upwardly, while not yet having contacted the substrate. The bonding head continues to approach the substrate, while the piezo element then is driven reversely in the upward direction. This causes the transducer to rotate out of its upwardly inclined position downwardly to the horizontal position and then to a position inclined downwardly to the substrate. In the downwardly inclined position, the contact of the capillary to the substrate is made.

Thus in this embodiment, the control means are adapted to perform the touch down operation by means of controlling the vertical movement of the piezo element 6. The bonding force can be more accurately determined and the positional accuracy of the bonding point is increased. As can be seen in FIG. 1, due to the rotation of the transducer 3 the linear displacement between the axis 13 of the transducer holder 7 and the capillary will vary depending on the amount of rotation of the transducer. When according to the present embodiment, the transducer is first inclined upwardly and then the touch down movement is supplied by the piezo element, the displacement caused by the rotational angle of the transducer is less. Thus, by performing the touch down operation by movement of the piezo element, the accuracy in placing the capillary with respect to the axis 13 can be improved.

It is also noted that the wire clamp 11 preferably comprises a piezo controlled clamp. The clamping pressure on the bonding wire can be precisely set by this clamp so that the wire is not deformed. It is also possible with the piezo controlled clamp to apply and adjust pressure exerted on the wire, using feedback, with a computer.

The aforementioned measures ensure that even the thinnest bonding wires are not destroyed by the wire clamp 11. FIG. 1 shows the piezo element associated with the wire clamp 11 with the reference number 14.

It is further noted that with the ball on the end of the bonding wire is associated a flame-off electrode which before touch down is directed out, in particular swung out, of the area of collision with the bonding head or the capillary 3 respectively, by the vertical movement of the bonding head.

According to FIG. 1, a strain gauge 15, or a similar distortion sensor, is also mounted on the holder 7, with which the distortion of the holder 7 and thus the bonding pressure can be measured to 0.1 gr and less during touch down. This measurement is used for adjustment of the linear motor 8 for the application and maintaining of a predetermined bonding pressure and weight.

I claim:

1. A bonding head for a wire bonding machine, comprising guide connected to transducer means for applying pressure and ultrasonic energy to a wire guided into contact with a surface on which a bond is to be formed and adjustment means for automatically adjusting said pressure, the adjustment means including a linear motor which couples to and is in linear alignment with a transducer holder carrying the transducer means, the adjustment means further including a spring means coupled to the transducer holder to urge the transducer means with the guide means toward the surface with a variable force.

2. The bonding head of claim 1, wherein said spring means is mounted at one end to a substantially linear displaceable element driven by the linear motor, substantially linear displacement of the element causing extension or contraction of the spring means.

3. The bonding head of claim 2, wherein the other end of the spring means is attached to the transducer holder, said holder being pivotally mounted to the head and connected to said transducer means, the transducer means being rotated by the variable urging force of the spring means.

4. The bonding head of claim 1, wherein the adjustment means comprise detecting means for determining the actual pressure applied to the wire and control means for automatically adjusting the force applied to said transducer means, to thereby obtain a predetermined pressure to be applied in the wire.

5. The bonding head of claim 4, wherein the control means comprise an electric control loop connected to drive said linear motor, the linear motor being driven to expand or contract the spring means, thereby adjusting its urging force on the transducer means to obtain the predetermined pressure to be applied to the wire.

6. The bonding head of claim 4, wherein the transducer means is pivoted about an axis, one end supporting the guide and the other end engaging said detecting means.

7. The bonding head of claim 4, further comprising drive means for vertically displacing the detecting means, the control means being adapted to operate said drive means at predetermined time intervals during movement of the bonding head.

8. The bonding head of claim 1, wherein a piezo controlled wire clamp is associated with a wire, so that the clamping pressure is adjustable whereby deformation of the bonding wire is avoided when the wire is clamped.

9. The bonding head of claim 1, wherein a strain gauge or similar distortion sensor is mounted on the holder by means of which during touch down the distortion of the holder and thus the bonding pressure is ascertained, whereby the corresponding signals are used for setting and adjusting the linear motor.

10. The bonding head of claim 4 wherein the detecting means comprises a piezo detector.

* * * * *